United States Patent
Han

(10) Patent No.: US 8,071,469 B2
(45) Date of Patent: Dec. 6, 2011

(54) SEMICONDUCTOR DEVICE AND METHOD OF FABRICATING THE SAME

(75) Inventor: Myoung-Hee Han, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/838,837

(22) Filed: Jul. 19, 2010

(65) Prior Publication Data

US 2010/0279500 A1 Nov. 4, 2010

Related U.S. Application Data

(62) Division of application No. 11/849,878, filed on Sep. 4, 2007, now Pat. No. 7,763,887.

(30) Foreign Application Priority Data

Sep. 4, 2006 (KR) .................. 10-2006-0084859

(51) Int. Cl.
H01L 21/768 (2006.01)

(52) U.S. Cl. .................. 438/601; 438/303; 438/151

(58) Field of Classification Search .................. 257/223, 257/227, 291, 292, 439, 443, 655, E27.1, 257/E27.125, E27.112, E29.117, E29.145, 257/E29.147, E29.151, E29.182, E29.202, 257/E29.273, E29.274, E29.275, E29.276, 257/E29.277, E29.278, E29.279, E29.28, 257/E29.281, E29.282, E29.283, E29.284, 257/E29.285, E29.286, E29.287, E29.288, 257/E29.289, E29.29, E29.291, E29.292; 257/E29.293, E29.294, E29.295, E29.296, 257/E29.297, E29.298, E29.299, E29.314, 257/E29.32, E23.016; 438/149, 257
See application file for complete search history.

(56) References Cited

U.S. PATENT DOCUMENTS

| 6,180,503 B1 | 1/2001 | Tzeng et al. | |
| 6,372,554 B1 | 4/2002 | Kawakita et al. | |
| 6,586,815 B2 * | 7/2003 | Ohhashi | 257/529 |
| 6,822,309 B2 * | 11/2004 | Hirota | 257/529 |

FOREIGN PATENT DOCUMENTS

| JP | 10-135340 | 5/1998 |
| JP | 2001-257264 | 9/2001 |
| JP | 2002-359285 | 12/2002 |
| JP | 2006-066500 | 3/2006 |
| KR | 1020010065329 | 7/2001 |

* cited by examiner

*Primary Examiner* — Marcos D Pizarro Crespo
*Assistant Examiner* — Sue Tang
(74) *Attorney, Agent, or Firm* — F. Chau & Associates, LLC

(57) ABSTRACT

A semiconductor device having increased reliability includes a fuse region and a monitoring region. Fuses are located on an insulation film in the fuse region and are exposed through fuse windows. A monitoring pattern is located on the insulation film in the monitoring region. The monitoring pattern includes sub-patterns that are exposed through a monitoring window.

9 Claims, 9 Drawing Sheets

SEMICONDUCTOR DEVICE AND METHOD OF FABRICATING THE SAME

CROSS REFERENCE TO RELATED APPLICATION

This application is a Divisional Application of U.S. patent application Ser. No. 11/849,878, filed on Sep. 4, 2007 now U.S. Pat. No. 7,763,887 which claims priority to and the benefit of Korean Patent Application No. 10-2006-0084859, filed on Sep. 4, 2006, in the Korean Intellectual Property Office the entire contents of both of which are incorporated by reference herein.

BACKGROUND OF INVENTION

1. Field of Invention

Embodiments of the present invention generally relate to semiconductor devices and methods of fabricating the same. More particularly, embodiments of the present invention relate to a semiconductor device and a method of fabricating the same having increased reliability.

2. Description of the Related Art

Generally, a semiconductor device can be fabricated through a fabrication process of forming cells having integrated circuits by repeatedly forming a circuit pattern on a substrate, and an assembly process of packaging the substrate, on which the cells are formed, into chips.

Further, an Electrical Die Sorting (EDS) process of testing the electrical properties of the cells formed on the substrate can be performed between the fabrication process and the assembly process. Bad cells on the substrate are sorted through the EDS process. Here, the sorted bad cells are replaced with previously fabricated redundant cells in a repair process, thereby increasing the yield of the semiconductor device because operation is normal at the time of actual chip operation.

The repair process can be performed by applying a laser beam to wires connected to the bad cells and cutting the wires. In this case, the wires to be cut by the laser beam are referred to as fuses, and the region in which the fuses are clustered close together is referred to as a fuse region. A fuse window for opening fuses is formed under insulation films in the fuse region. When the fuse window is formed, a predetermined number of the fuses located under interlayer dielectric film are also etched, thus determining the thickness of the fuses.

However, as the amount of etching of fuses increases when the fuse window is formed, the thickness of the fuses decreases. As a result, neighboring fuses can be damaged during the repair process. In contrast, when the amount of etching of fuses decreases, the thickness of the fuses increases. As a result, the fuses cannot be completely cut during the repair process. Accordingly, a method of forming a monitoring pattern for monitoring the thickness of the fuses is being sought.

However, if a monitoring pattern is formed in a shape resembling a flat plate, the insulation film cannot be formed to a substantially uniform thickness when the insulation film is deposited on the fuses and the monitoring pattern. For example, the insulation film might be more thickly formed at the center of the monitoring pattern than at peripheral regions thereof. If the thickness of the insulation film on the fuses and the monitoring pattern is not substantially uniform, then the degree to which the insulation film is etched is different at the time of formation of the fuse window and the monitoring window. As a result, the residual thicknesses of the fuses and the monitoring pattern are also different. Accordingly, the thickness of the fuses cannot be accurately monitored.

SUMMARY

One feature provided by the embodiments exemplarily described herein can be characterized as a semiconductor device having increased reliability. Another feature provided by the embodiments exemplarily described herein can be characterized as a method of fabricating the semiconductor device.

The features of the embodiments exemplarily described herein are not limited to those explicitly mentioned above, and other features will be more clearly understood by those skilled in the art from the following detailed description.

One exemplary embodiment of the present invention can be characterized as a semiconductor device that includes a semiconductor substrate having a fuse region and a monitoring region; an insulation film formed on the semiconductor substrate in the fuse region and the monitoring region; a plurality of fuses located on the insulation film in the fuse region, wherein at least one of the plurality of fuses is exposed by a fuse window; and a monitoring pattern located on the insulation film in the monitoring region, wherein the monitoring pattern includes a plurality of sub-patterns and wherein at least one of the plurality of sub-patterns is exposed by a monitoring window.

Another exemplary embodiment of the present invention can be characterized as a method of fabricating a semiconductor device that includes forming an insulation film on a semiconductor substrate including a fuse region and a monitoring region; forming a conductive material on the insulation film; patterning the conductive material to form a plurality of fuses in the fuse region and a monitoring pattern in the monitoring region, wherein the monitoring pattern includes a plurality of sub-patterns; forming an interlayer dielectric film on the plurality of fuses and the monitoring pattern; and patterning the interlayer dielectric film to form a fuse window exposing at least one of the plurality of fuses and a monitoring window exposing at least one of the plurality of sub-patterns.

BRIEF DESCRIPTION OF THE DRAWINGS

Hereinafter, embodiments of the present invention will be described with reference to the accompanying drawings, in which.

DETAILED DESCRIPTION

Figure 1:
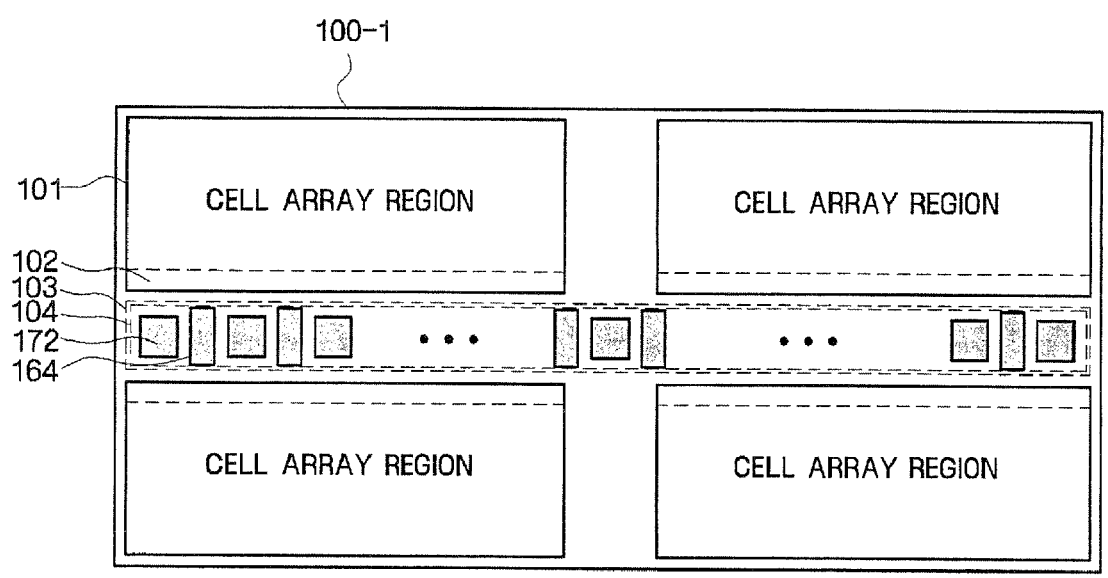
FIG. 1 is a schematic diagram showing a semiconductor device according to one exemplary embodiment.

The above and other features of the embodiments will be more clearly understood from the following detailed description taken in conjunction with the accompanying drawings.

However, although the embodiments have been exemplarily disclosed for illustrative purposes, those skilled in the art will appreciate that various modifications, additions and substitutions are possible, without departing from the scope and spirit of the invention as disclosed in the accompanying claims. Reference now should be made to the drawings, in which the same reference numerals are used throughout the different drawings to designate the same or similar components.

A semiconductor device according to some embodiments will be described with reference to the accompanying drawings below. First, a schematic construction of an exemplary semiconductor device according to one embodiment will be described with reference to FIG. 1. FIG. 1 is a schematic diagram showing a semiconductor device according to one exemplary embodiment.

Referring to FIG. 1, a semiconductor substrate 100-1 may, for example, include a plurality of cell array regions 101 and a pad region 103 located between the plurality of cell array regions 101.

Memory cells for storing data, such as gate lines (not shown), bit lines (not shown) and capacitors (not shown), may be formed in each of the cell array regions 101. A fuse region 102 including clustered fuses, which can be cut by a laser beam at the time of the generation of bad cells, may be located on the edge of each of the cell array regions 101.

The pad region 103 may be located between the cell array regions 101, and a plurality of pads 172 may be arranged in the pad region 103. In one embodiment, the pads 172 are connected with the cells in the cell array regions 101 and may be used to input and output power source voltages, ground voltages, control signals and data signals at the time of testing the operation of the semiconductor device. Further, a monitoring region 104 for monitoring the thicknesses of the fuses located in the fuse regions 102 may be located in the pad region 103. The monitoring region 104 may, for example, include monitoring patterns (see 129 in FIG. 4) and monitoring windows 164 for exposing the monitoring patterns (see 129 in FIG. 4). Although the monitoring windows 164 are shown in FIG. 1 as being alternately located between the pads 172, the locations of the monitoring windows 164 may be changed.

Figure 2:
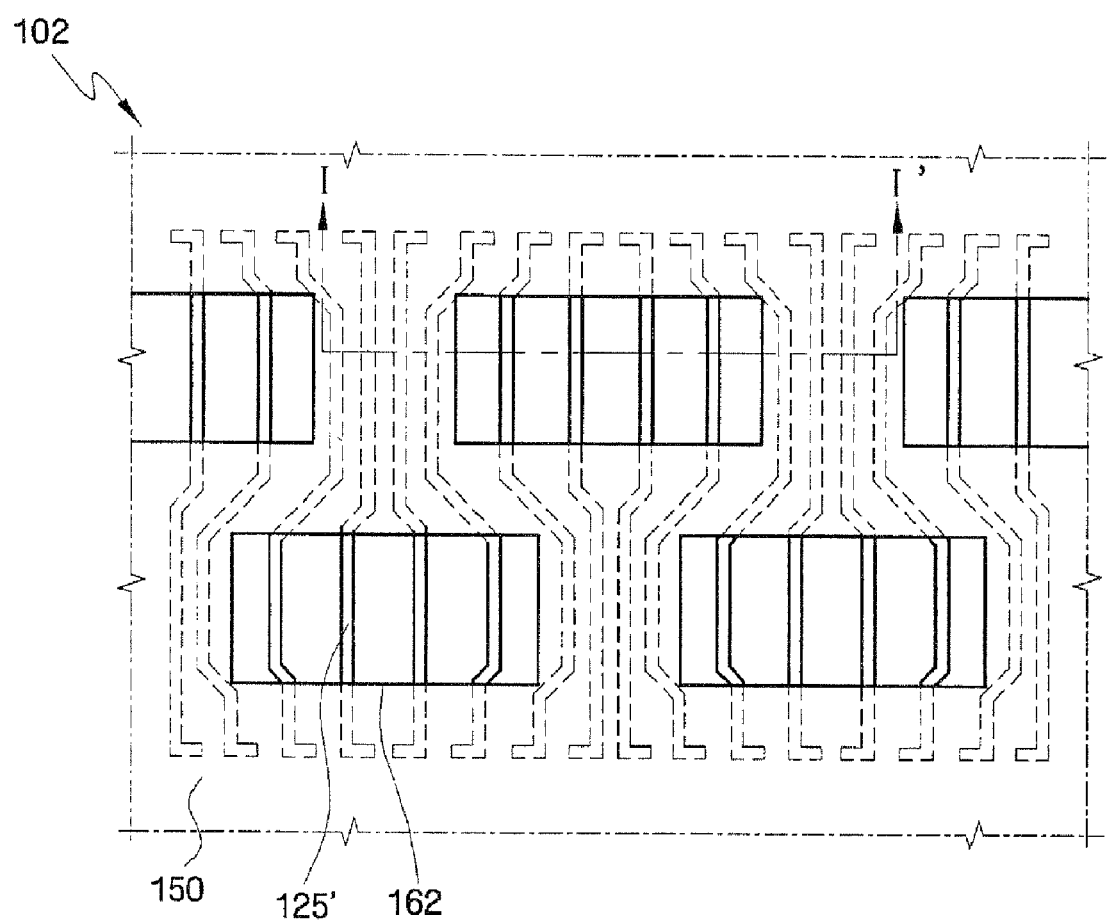
FIG. 2 is a plan view showing a fuse region shown in FIG. 1, according to one exemplary embodiment.

The structure of the semiconductor device shown in FIG. 1 will be described in detail with reference to FIGS. 2, 3A to 3D, and 4. FIG. 2 is a plan view showing a fuse region shown in FIG. 1, according to one exemplary embodiment. FIGS. 3A to 3D are plan views showing monitoring regions shown in FIG. 1, according to one exemplary embodiment. FIG. 4 is a sectional view showing the fuse region and the monitoring region taken along line I-I' of FIG. 2 and lines II-II' of FIGS. 3A to 3D.

The fuse region will be described with reference to FIGS. 2 and 4. As shown in FIGS. 2 and 4, an insulation film 110 is formed on a substrate 100 in the fuse region 102. The insulation film 110 may be a multi-layer laminated film.

A plurality of fuses 125' are formed on the insulation film 110 of the fuse region 102. The fuses 125' are connected with bit lines (not shown) in the cell array region 101, and are cut using a laser beam when bad cells are generated.

In one embodiment, the fuses 125' are formed in curved shapes such that a pitch between adjacent fuses 125' (i.e., a first pitch) is variable. Specifically, the fuse region 102 may be divided into regions in which the first pitch $P_1$ between the fuses 125' is wide and regions in which the first pitch $P_1$ between the fuses 125' is narrow. That is, the regions in which the first pitch $P_1$ between the fuses 125' is wide correspond to cut regions in which the fuses 125' can be cut by applying a laser beam thereto. The regions in which the first pitch $P_1$ between the fuses 125' is narrow correspond to uncut regions to which no laser beam can be (or is designed to be) applied. Alternatively, the fuses 125' may be formed in straight line shapes, and thus may be arranged to be substantially parallel to each other at predetermined intervals.

The fuses 125' may include a metal material and may be formed on the same layer as metal wires located in the cell array region 101. Accordingly, the fuses 125' may be located in the upper portion of the semiconductor device.

An interlayer dielectric film 130 (e.g., a multi-layered dielectric film 130) and a passivation film 150 are layered on the insulation film 110 and on the fuses 125'. A plurality of fuse windows 162 for exposing the fuses 125' may be formed in the interlayer dielectric film 130 and the passivation film 150. For example, the fuse windows 162 are formed in the cut regions in which the first pitch $P_1$ between the fuses 125' is wide, thereby exposing the fuses 125' in the cut regions.

Further, a guard ring 142 may be formed on the interlayer dielectric film 130 around the fuse windows 162 to prevent moisture from permeating into the semiconductor device through the fuse windows 162. The guard ring 142 may, for example, include a metal pattern and may overlap the fuses 125' in the uncut regions.

A monitoring region 104 will be described with reference to FIGS. 3A to 3D and 4. As shown in FIG. 4, an insulation film 110 is formed on a semiconductor substrate 100 in the monitoring region 104 as described with respect to the fuse regions 102.

A monitoring pattern 129 including a plurality of sub-patterns 127' may be formed on the insulation film 110 at a second pitch $P_2$. In one embodiment, the monitoring pattern 129 may be formed on the same layer as the fuses 125'. In a further embodiment, the monitoring pattern 129 may include the same metal material as the fuses 125'.

Figure 3A:
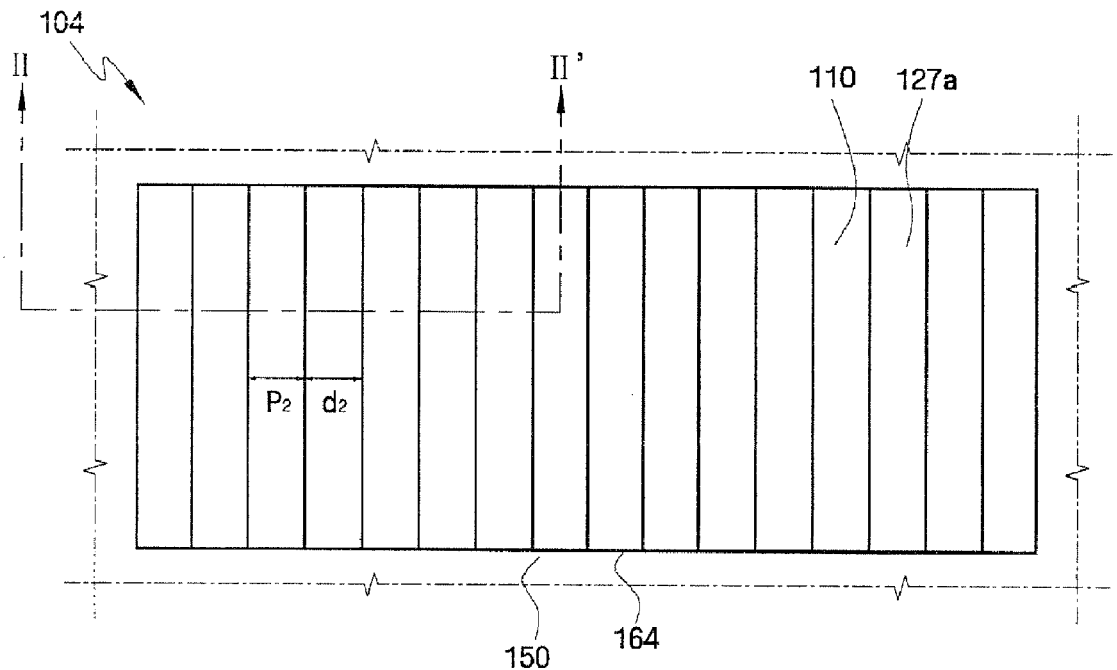
FIGS. 3A to 3D are plan views showing monitoring regions shown in FIG. 1, according to one exemplary embodiment.
Figure 4:
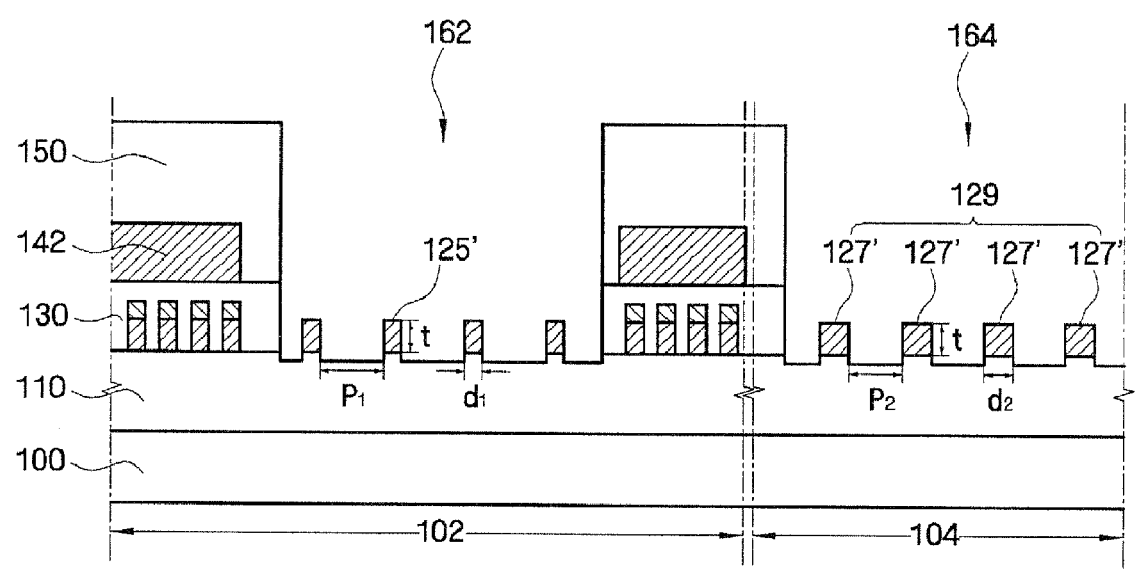
FIG. 4 is a sectional view showing the fuse region and the monitoring region taken along line I-I' of FIG. 2 and lines II-II' of FIGS. 3A to 3D.

In one embodiment exemplarily shown in FIG. 3A, the sub-patterns 127' constituting the monitoring pattern 129 may be provided as sub-patterns 127a having substantially parallel and substantially straight line shapes arranged at the second pitch $P_2$. Accordingly, the insulation film 110 may be exposed between the sub-patterns 127a.

Figure 3B:
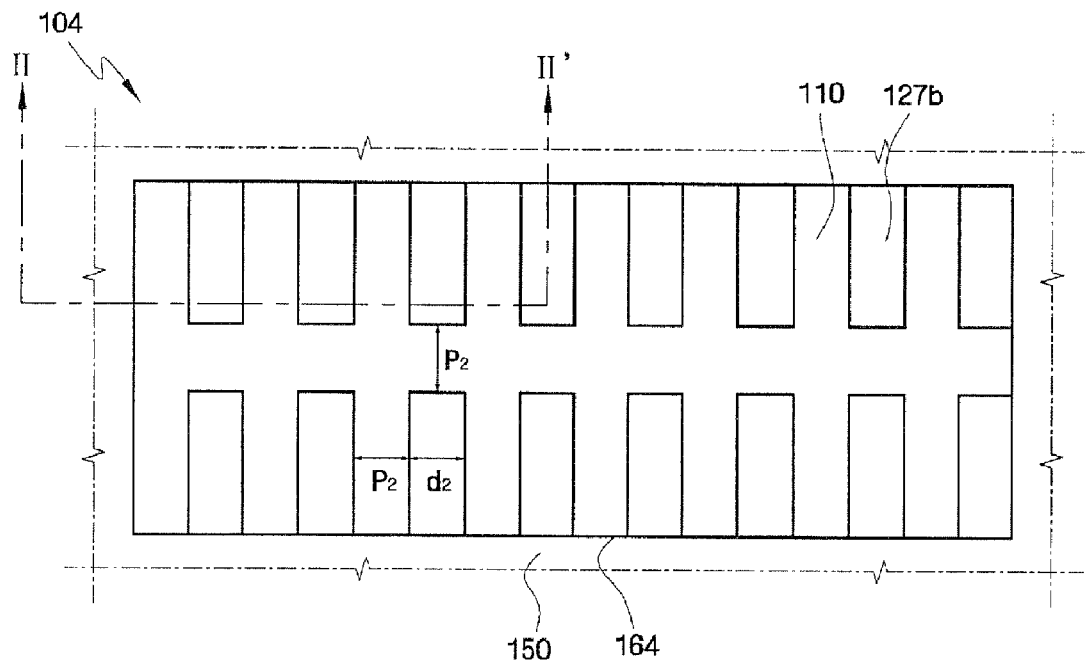

In another embodiment exemplarily shown in FIG. 3B, the sub-patterns 127' constituting the monitoring pattern 129 may be provided as sub-patterns 127b having a major longitudinal axis aligned along a first direction. The sub-patterns 127b are similar to the sub-patterns 127a but have center portions thereof removed so as to expose the insulation film 110. Accordingly, the sub-patterns 127b may be bar-shaped sub-patterns divided along substantially straight lines.

Figure 3C:
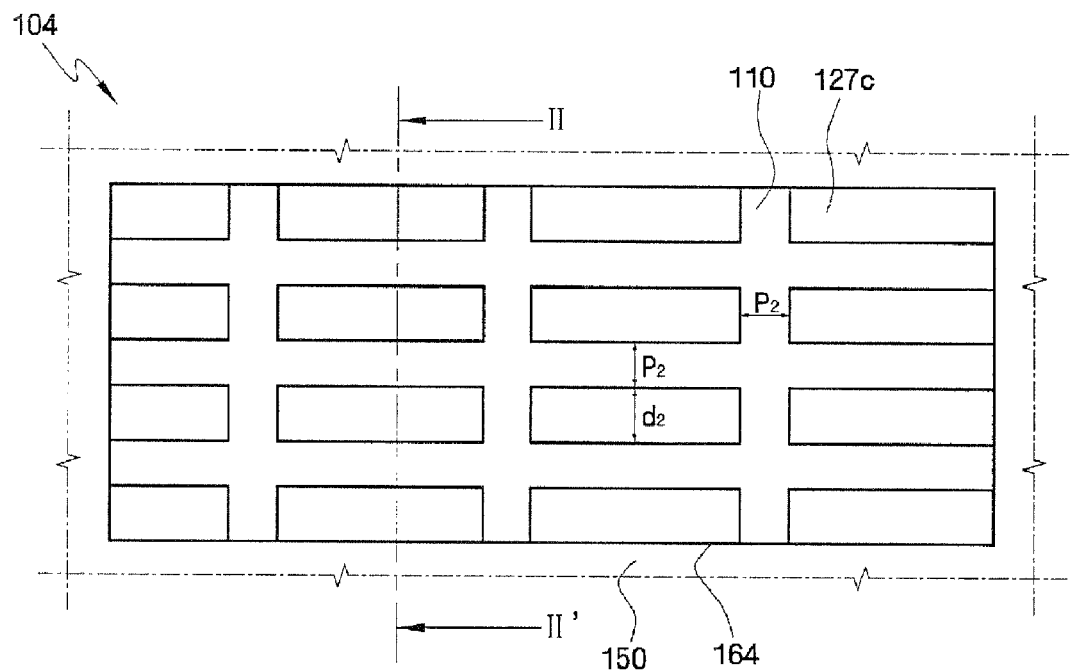

In another embodiment exemplarily shown in FIG. 3C, the sub-patterns 127' constituting the monitoring pattern 129 may be provided as sub-patterns 127c having a major longitudinal axis aligned along a second direction. The sub-patterns 127c are similar to the sub-patterns 127a but have numerous portions thereof removed so as to expose the insulation film 110. Accordingly, the sub-patterns 127c may be bar-shaped sub-patterns divided along substantially straight lines.

Figure 3D:
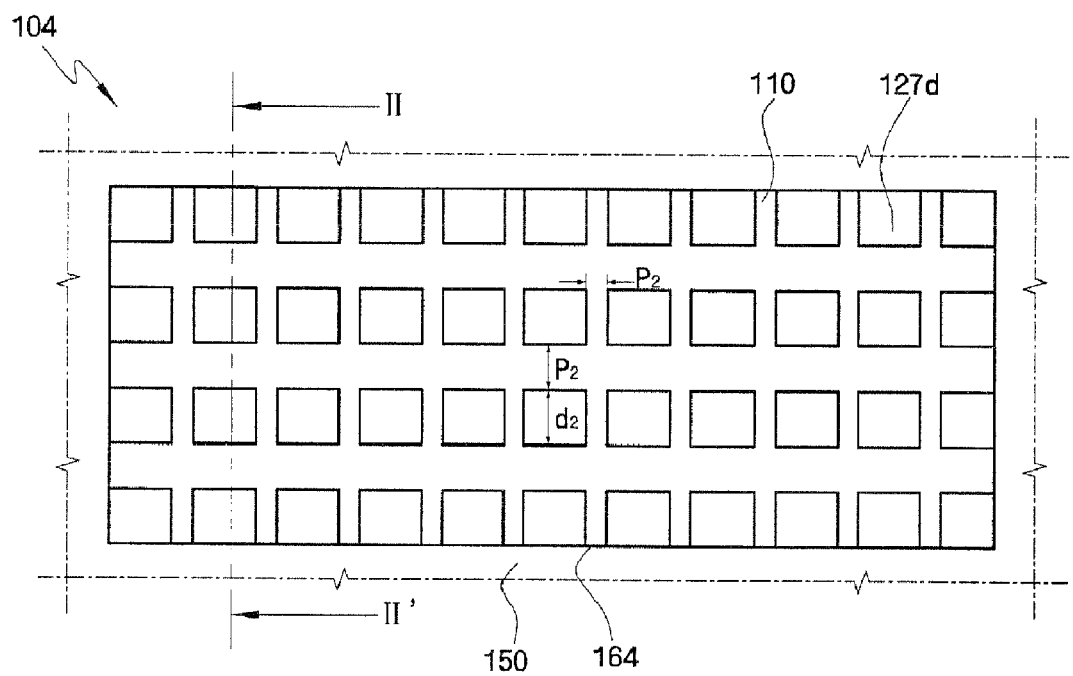

In one embodiment exemplarily shown in FIG. 3D, the sub-patterns 127' constituting the monitoring pattern 129 may be provided as sub-patterns 127d having substantially square shapes, circular or polygonal shapes, arranged in a matrix pattern.

It will be appreciated that the structures and arrangements of the sub-patterns 127a, 127b, 127c and 127d are not limited thereto, and may be modified in various types. In one embodiment, the widths d2 of the aforementioned sub-patterns 127a, 127b, 127c and 127d may be substantially equal to the widths d1 of the fuses 125'.

An interlayer dielectric film 130 and a passivation film 150 are formed around the monitoring patterns 129. A monitoring window 164 for exposing the monitoring patterns 129 is formed in the interlayer dielectric film 130 and passivation film 150. The sub-patterns 127' of the monitoring pattern 129 exposed through the monitoring windows 164 have substantially the same thickness "t" as the fuses 125' exposed through the fuse windows 162.

Accordingly, the thickness t of the fuses 125' can be monitored by physically or electrically measuring the thickness t of the sub-patterns 127' of the monitoring pattern 129 through the monitoring window 164.

Figure 5:
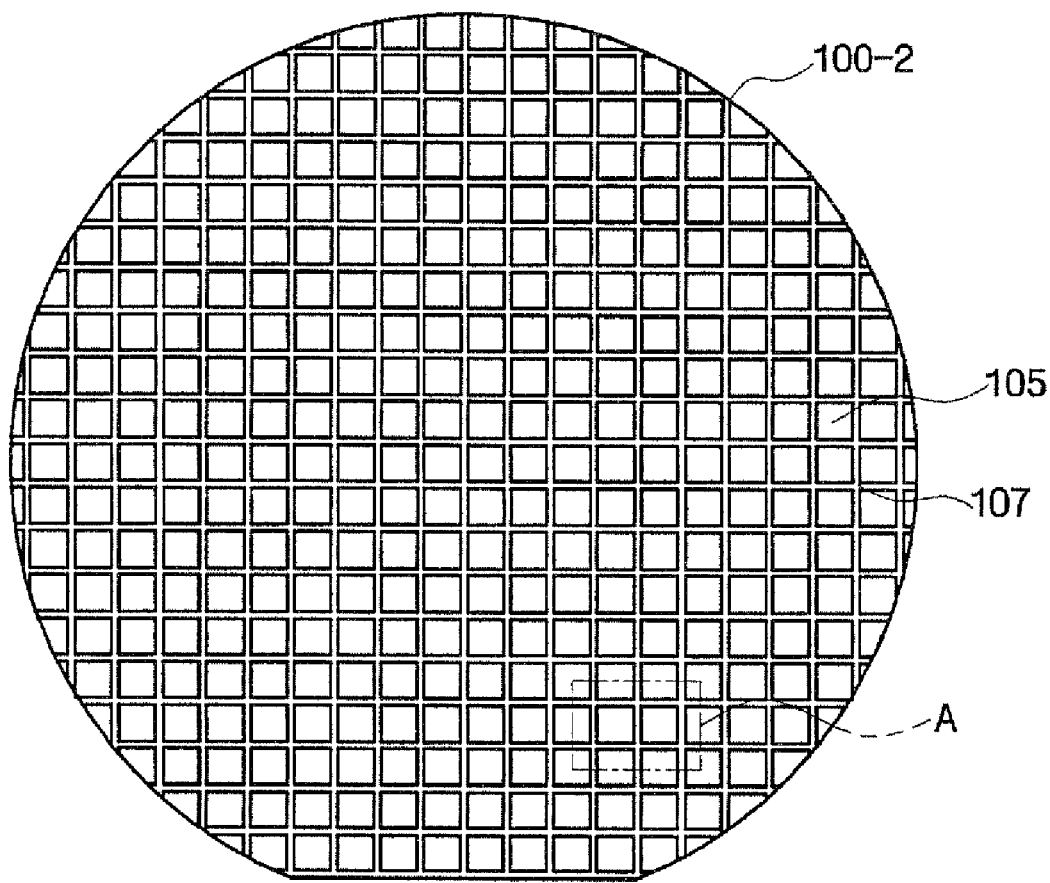
FIG. 5 is a plan view showing a semiconductor device according to another exemplary embodiment.
Figure 6:
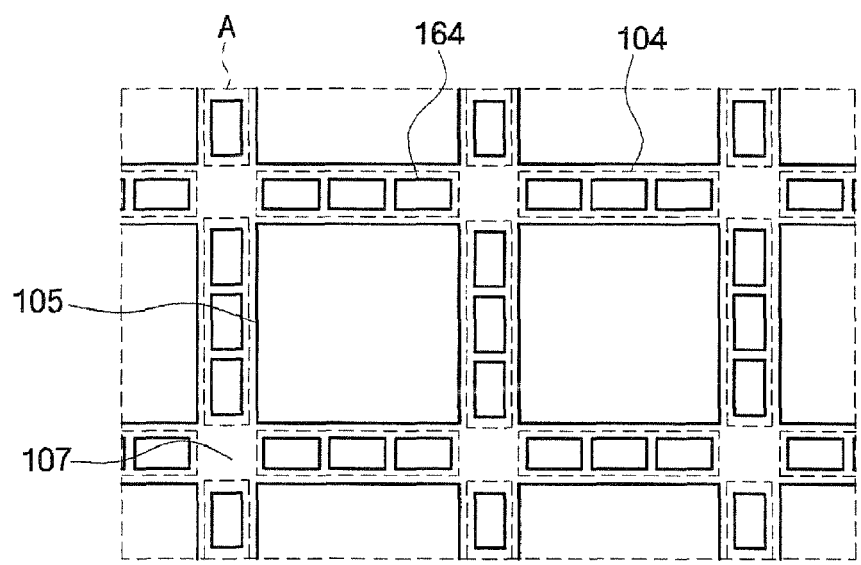
FIG. 6 is an enlarged view showing portion A of FIG. 5.

A semiconductor device according to another embodiment will be described with reference to FIGS. 5 and 6. FIG. 5 is a plan view showing a semiconductor device according to another exemplary embodiment. FIG. 6 is an enlarged view showing portion A of FIG. 5.

Referring to FIGS. 5 and 6, a semiconductor substrate 100-2 may, for example, include a plurality of chip regions 105 and scribe lines 107 dividing the chip regions 105. The chip regions 105 may be arranged at predetermined intervals in a matrix pattern.

Fuse regions (not shown), similar to fuse regions 102 described above with respect to FIGS. 2 and 4, may be located in the plurality of chip regions 105. Monitoring regions (not shown), similar to monitoring regions 104 described above with respect to FIGS. 1, 3A-3D and 4, may be located in the scribe lines 107.

Since the structures of the fuse regions located in the chip regions 105 and the monitoring regions located in the scribe lines 107 may be identical to the structures described in FIG. 1-4, a detailed description thereof will be omitted to avoid repetitive description.

In view of the above, it is possible to secure the areas of the chip regions 105 by forming monitoring patterns (e.g., see 129 in FIG. 4) in the scribe lines 107. When the thicknesses of the fuses (e.g., see 125' in FIG. 4) in the fuse regions (e.g., see 102 in FIG. 4) are monitored, chips are completed in the chip regions 105. The chips are then separated along the scribe lines 107 and the monitoring patterns can also be simultaneously removed. Accordingly, it is possible to increase process efficiency.

Next, an exemplary method of fabricating the semiconductor device according to one embodiment will be described with reference to FIGS. 7 to 10.

Figure 7:
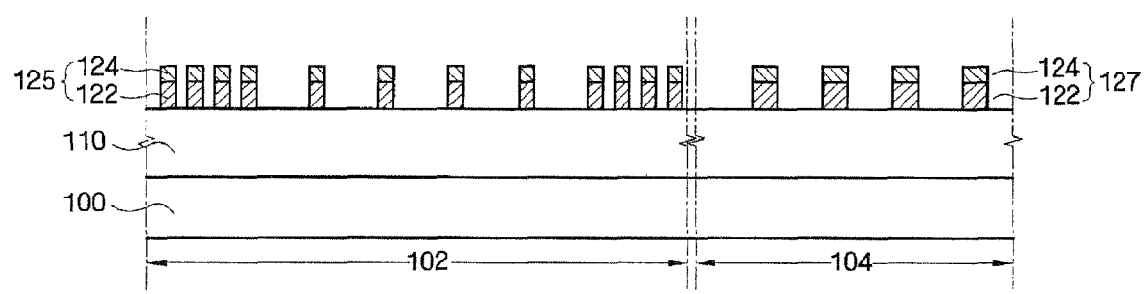
FIGS. 7 to 10 are sectional views sequentially showing an exemplary method of fabricating the semiconductor device according to one embodiment.

First, as shown in FIG. 7, an insulation film 110 may be formed on a semiconductor substrate 100 including fuse regions 102 and one or more monitoring regions 104. Gate lines (not shown), bit lines (not shown), capacitors (not shown) and the like may be located under the insulation film 110 in the cell array regions 101.

Next, one or more conductive films may be deposited on the insulation film 110. For example, a barrier film (not shown), a metal film 122 and a capping film 124 may be sequentially layered on the insulation film 110. The barrier film (not shown) and the capping film 124 can be formed by sequentially depositing titanium (Ti) and titanium nitride (TiN) using, for example, a chemical vapor deposition (CVD) method, a sputtering method, or the like or a combination thereof. The metal film 122 can include a metal such as aluminum (Al), tungsten (W), copper (Cu), or the like or a combination thereof.

Then, a mask pattern (not shown) for forming the metal wires (not shown) in the cell array regions 101, the fuses in the fuse regions 102 and monitoring patterns 129, which include a plurality of sub-patterns, in the monitoring region 104, may be formed on the capping film 124. Here, the portion of the mask pattern above the monitoring region 104 may formed in substantially the same shape as the shapes exemplarily described in FIGS. 3A to 3D.

The conductive films (i.e., the barrier film (not shown), the metal film 122 and the capping film 124) may then be etched using the mask pattern as an etching mask until the upper portion of the insulation film 110 is exposed. Accordingly, metal wires may be formed in the cell array regions (e.g., see 101 in FIG. 1), a plurality of fuses 125 may be formed in the fuse regions (e.g., see 102 in FIG. 1) and sub-patterns 127 may be formed in the monitoring region (e.g., see 104 in FIG. 1).

The plurality of fuses 125 may be provided as substantially straight lines which are substantially parallel to each other and arranged at a predetermined interval or, as shown in FIG. 2, may be provided to have curved shapes. Fuses 125 provided to have curved shapes may have a relatively wide pitch in cut regions and a relatively narrow pitch in the uncut regions.

The plurality of sub-patterns 127 formed in the monitoring region (e.g., see 104 in FIG. 1) may be formed depending on the shape of the mask pattern. That is, the monitoring pattern includes the plurality of sub-patterns 127 spaced apart from each other, and the insulation film 110 may be exposed between the sub-patterns 127.

For example, as described above with reference to FIG. 3A, the sub-patterns 127 may be provided as sub-patterns 127a having substantially parallel and substantially straight line shapes arranged at the second pitch $P_2$. As shown in FIG. 3B, the sub-patterns 127 may be provided as sub-patterns 127b which are similar to sub-patterns 127a but having center portions removed to expose the insulation film 110. As shown in FIG. 3C, the sub-patterns 127 may be provided as sub-patterns 127c which are similar to sub-patterns 127a but having one or more predetermined regions removed to expose the insulation film 110. As shown in FIG. 4D, the sub-patterns 127d may be formed in substantially square shapes, circular or polygonal shapes and may be arranged in a matrix pattern.

Figure 8:
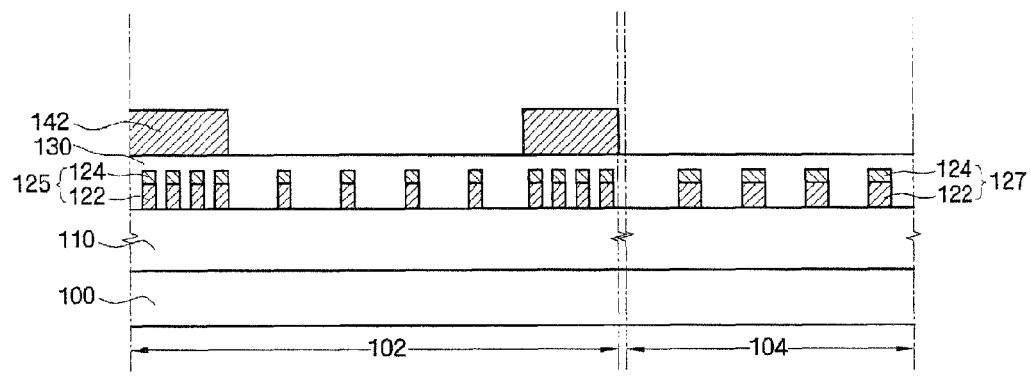

Then, as shown in FIG. 8, an interlayer dielectric film 130 may be formed on the insulation film 110 on which the plurality of fuses 125 and sub-patterns 127 is formed. In one embodiment, the interlayer dielectric film 130 may be multi-layered. In another embodiment, the interlayer dielectric film 130 may include TEOS (TEtraethly Ortho Silicate), USG (Undoped Silicate Glass), PSG (PhosphoSilicate Glass), BSG (BorosilicateGlass), BPSG (BoroPhosphoSilicate Glass), FSG (Fluoride Silicate Glass), SOG (Spin On Glass), TOSZ (TOnen SilaZene), or the like or a combination thereof.

Upon forming the interlayer dielectric film 130, insulating material substantially fills spaces between the adjacent fuses 125 and between the adjacent sub-patterns 127. Accordingly, the interlayer dielectric film 130 may have a substantially uniform thickness over the fuses 125 and the sub-patterns 127.

After forming the interlayer dielectric film 130, a metal film may deposited on the interlayer dielectric film 130 and patterned to thereby forming metal wires (not shown) in the cell array regions 101 and forming guard rings 142 in the fuse regions 102. The guard rings 142 may be formed on the interlayer dielectric film 130 in the uncut regions in which the first pitch $P_1$ between the fuses 125 is relatively narrow. The guard rings 142 can prevent damage to the fuses 125 in the uncut regions when the fuses 125 in the cut region are cut.

Figure 9:
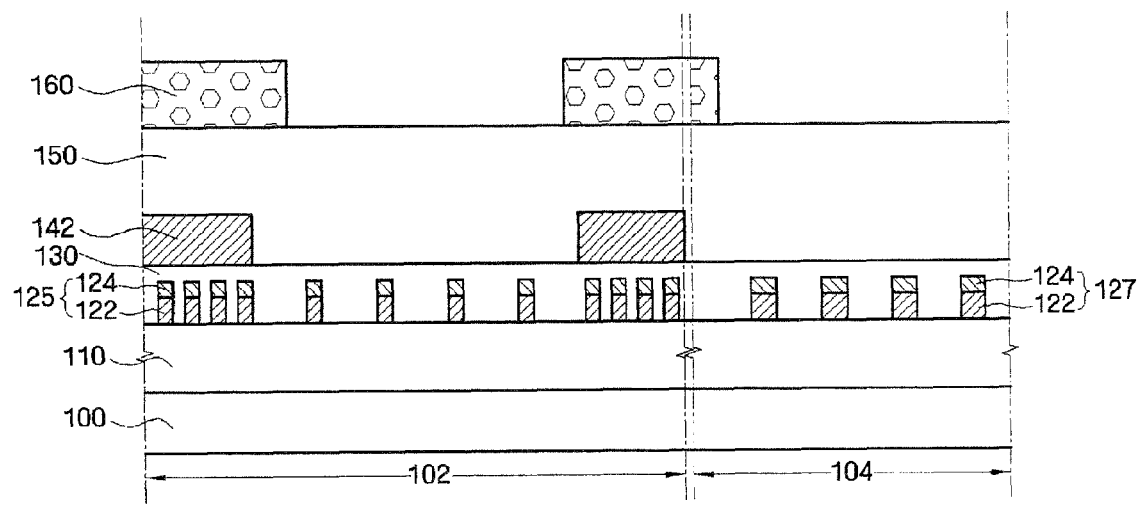

Next, as shown in FIG. 9, a passivation film 150 having sufficient thickness is formed on the interlayer dielectric film 130 on which guard rings 142 are formed. The passivation film 150 may, for example, include silicon oxide, silicon nitride, polyimide, or the like or a combination thereof.

Then, a mask pattern 160 for forming fuse windows 162 and monitoring windows 164 may be formed on the passivation film 150. In the illustrated embodiment, the surface of the passivation film 150 in the cut regions of the fuse regions 102 and the monitoring region 104 may be exposed by the mask pattern 160.

Figure 10:
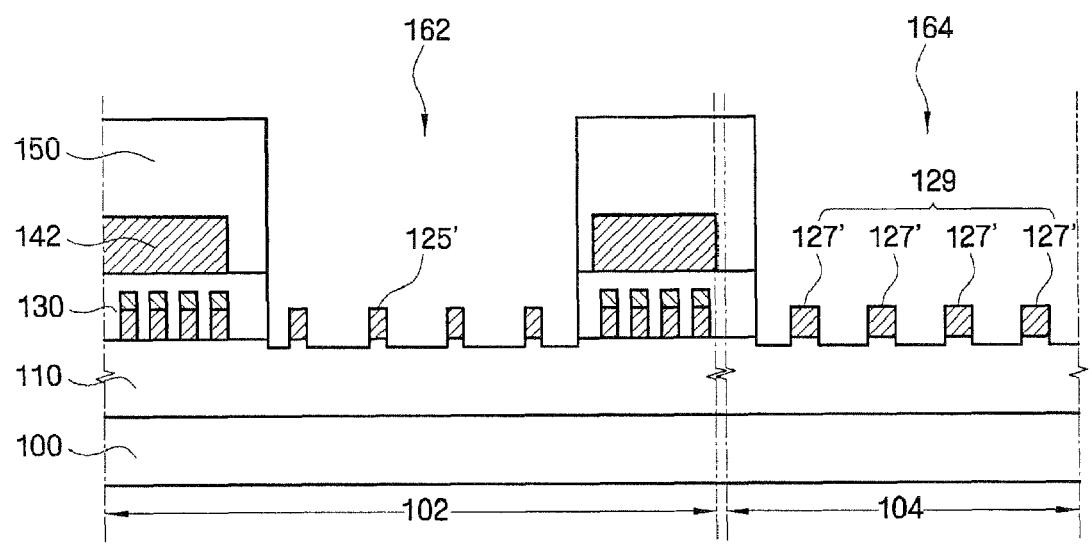

Next, as shown in FIG. 10, the fuse windows 162 and the monitoring windows 164 may be formed by etching the passivation film 150 and the interlayer dielectric film 130 using the mask pattern 160 as a mask. In one embodiment, the fuse windows 162 and monitoring windows 164 may expose the conductive layers of the fuses 125 and sub-patterns 127. In the illustrated embodiment, the interlayer dielectric film 130 and the passivation layer 150 have substantially the same thickness over the fuses 125 and the sub-patterns 127 of the monitoring pattern 129. Accordingly, the interlayer dielectric film 130 and the passivation layer 150 are etched and removed by substantially the same amount during the etching process for the formation of the fuse windows 162 and the monitoring windows 164. Accordingly, the fuses 125 and the sub-patterns 127 may be exposed substantially simultaneously.

Further, when the fuse windows 162 and the monitoring windows 164 are formed, parts of the fuses 125' and the sub-patterns 127' of the monitoring pattern 129 also are simultaneously etched due to excessive etching of the passivation film 150 and the interlayer dielectric film 130. A part of the insulation film 110 between the fuses 125' and the sub-patterns 127' may also be etched due to excessive etching of the passivation film 150 and the interlayer dielectric film 130. Accordingly, a part of the capping film 124 on the fuses 125' and the sub-patterns 127' is removed and a part of the insulation film 110 is also removed. The thickness of the fuses 125' and the sub-patterns 127' exposed through the fuse windows 162 and the monitoring windows 164 can be adjusted during the etching process. Accordingly, the fuses 125' and the sub-patterns 127' of the monitoring pattern 129 exposed through the fuse windows 162 and the monitoring windows 164 can have a predetermined thickness t.

The embodiments exemplarily described above allow the thickness t of the fuses 125' in the fuse regions 102 to be monitored by measuring the thickness t of the monitoring pattern 129 including the plurality of sub-patterns 127' through the monitoring window 164. That is, the thickness t of the fuses 125' can be monitored by measuring the thickness t of the sub-patterns 127' of the monitoring pattern 129 using a physical method through the monitoring window 164. Further, the thickness t of the fuses 125' can be monitored by measuring the resistance value of the sub-patterns 127' before and after the formation of the monitoring window 164 using an electrical method.

According to the embodiments exemplarily described above, the interlayer dielectric 130 film and the passivation film 150 can be formed to have substantially the same thickness over the fuses and the monitoring patterns. Therefore, when the fuse windows and the monitoring windows are formed, the fuses and the monitoring patterns can also be exposed substantially simultaneously. Moreover, the fuses and the sub-patterns of the monitoring patterns exposed through the fuse windows and the monitoring windows can have substantially the same thickness. Because the thickness of the fuses can be accurately monitored using the monitoring pattern, it is possible to increase the yield and reliability of the semiconductor device.

Although the embodiments of the present invention have been exemplarily described with reference to the accompanying drawings, those skilled in the art will appreciate that the present invention can be realized by other specific embodiments, without changing the technical spirit or essential features thereof. Accordingly, it must be understood that the embodiments described above are exemplary, but not limited in all aspects.

What is claimed is:

1. A method of fabricating a semiconductor device, comprising:
    forming an insulation film on a semiconductor substrate including a fuse region and a monitoring region;
    forming a conductive material on the insulation film;
    patterning the conductive material to form a plurality of fuses in the fuse region and a monitoring pattern in the monitoring region, wherein the monitoring pattern includes a plurality of sub-patterns;
    forming an interlayer dielectric film on the plurality of fuses and the monitoring pattern; and
    patterning the interlayer dielectric film to form a fuse window exposing at least one of the plurality of fuses in the fuse region and a monitoring window exposing at least one of the plurality of sub-patterns in the monitoring region, the fuse window being separate from the monitoring window.

2. The method of claim 1, wherein forming the conductive material comprises forming the conductive material directly on the insulation film.

3. The method of claim 1, wherein the plurality of sub-patterns are spaced apart from each other and wherein the insulation film is exposed between the plurality of sub-patterns.

4. The method of claim 1, wherein the plurality of sub-patterns comprise substantially straight line shapes.

5. The method of claim 1, wherein the plurality of sub-patterns comprise substantially square shapes arranged in a matrix pattern.

6. The method of claim 1, wherein the semiconductor substrate comprises a plurality of cell array regions and a pad region between the cell array regions, and the fuse region is located in one of the plurality of cell array regions and the monitoring region is located in the pad region.

7. The method of claim 1, wherein the semiconductor substrate comprises a plurality of chip regions and a scribe line dividing the plurality of chip regions, and the fuse region is located in one of the chip region and the monitoring region is located in the scribe line.

8. The method of claim 1, wherein a thickness of at least one of the plurality of fuses is substantially equal to a thickness of a least one of the plurality of sub-patterns.

9. The method of claim 1, wherein the conductive material comprises a metal.

* * * * *